United States Patent
Naito

(10) Patent No.: US 10,211,299 B2
(45) Date of Patent: Feb. 19, 2019

(54) SEMICONDUCTOR DEVICE AND SEMICONDUCTOR DEVICE MANUFACTURING METHOD

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/638,409

(22) Filed: Jun. 30, 2017

(65) Prior Publication Data

US 2017/0317175 A1    Nov. 2, 2017

Related U.S. Application Data

(63) Continuation of application No. PCT/JP2016/070103, filed on Jul. 7, 2016.

(30) Foreign Application Priority Data

Jul. 16, 2015   (JP) .................................. 2015-142184

(51) Int. Cl.
    *H01L 29/66*    (2006.01)
    *H01L 29/40*    (2006.01)
    (Continued)

(52) U.S. Cl.
    CPC ........ *H01L 29/407* (2013.01); *H01L 27/0664* (2013.01); *H01L 27/0727* (2013.01);
    (Continued)

(58) Field of Classification Search
    CPC .............. H01L 29/7397; H01L 29/407; H01L 29/4236; H01L 27/0652; H01L 27/0629
    (Continued)

(56) References Cited

U.S. PATENT DOCUMENTS 5,329,142 A    7/1994   Kitagawa et al.
6,118,150 A    9/2000   Takahashi
(Continued)

FOREIGN PATENT DOCUMENTS

JP    H05-243561 A    9/1993
JP    H09-270512 A    10/1997
(Continued)

OTHER PUBLICATIONS

International Search Report for International Patent Application No. PCT/JP2016/070103, issued by the Japan Patent Office dated Sep. 13, 2016.

(Continued)

*Primary Examiner* — Vu A Vu

(57) ABSTRACT

Provided is a semiconductor device including a semiconductor substrate; a gate trench portion formed in a front surface of the semiconductor substrate; a dummy trench portion formed in the front surface of the semiconductor substrate; and a first front-surface-side electrode that includes metal and is formed above the front surface of the semiconductor substrate. The gate trench portion includes a gate trench formed in the front surface of the semiconductor substrate; a gate conducting portion formed inside the gate trench; and a gate insulating portion that is formed above the gate conducting portion inside the gate trench and provides insulation between the gate conducting portion and the first front-surface-side electrode. The dummy trench portion includes a dummy trench formed in the front surface of the semiconductor substrate; and a dummy conducting portion that is formed inside the dummy trench and contacts the first front-surface-side electrode.

19 Claims, 10 Drawing Sheets

(51) Int. Cl.
    *H01L 27/06*    (2006.01)
    *H01L 29/739*   (2006.01)
    *H01L 29/423*   (2006.01)
    *H01L 27/07*    (2006.01)
    *H01L 29/06*    (2006.01)
    *H01L 29/08*    (2006.01)

(52) U.S. Cl.
    CPC ...... *H01L 29/0696* (2013.01); *H01L 29/0834* (2013.01); *H01L 29/401* (2013.01); *H01L 29/4236* (2013.01); *H01L 29/4238* (2013.01); *H01L 29/66348* (2013.01); *H01L 29/7397* (2013.01)

(58) Field of Classification Search
    USPC ........................................................ 257/140
    See application file for complete search history.

(56) References Cited

U.S. PATENT DOCUMENTS

| | | | |
|---|---|---|---|
| 6,180,966 B1* | 1/2001 | Kohno | H01L 29/7397 257/173 |
| 8,680,610 B2* | 3/2014 | Hsieh | H01L 29/7813 257/302 |
| 8,692,322 B2* | 4/2014 | Pan | H01L 29/407 257/334 |
| 8,698,195 B2* | 4/2014 | Oya | H01L 29/0696 257/133 |
| 2002/0179976 A1 | 12/2002 | Takahashi | |
| 2004/0021174 A1 | 2/2004 | Kobayashi | |
| 2009/0111230 A1 | 4/2009 | Nishimura | |
| 2009/0189181 A1 | 7/2009 | Koyama et al. | |
| 2009/0283797 A1 | 11/2009 | Takahashi et al. | |
| 2013/0056822 A1 | 3/2013 | Senoo | |
| 2013/0075784 A1 | 3/2013 | Ikeda | |
| 2013/0153900 A1 | 6/2013 | Kinouchi et al. | |
| 2014/0070266 A1 | 3/2014 | Matsudai et al. | |
| 2014/0077256 A1 | 3/2014 | Hikasa | |
| 2014/0203356 A1 | 7/2014 | Kagata et al. | |
| 2016/0027906 A1 | 1/2016 | Onozawa | |

FOREIGN PATENT DOCUMENTS

| | | |
|---|---|---|
| JP | 2002-353456 A | 12/2002 |
| JP | 2003318396 A | 11/2003 |
| JP | 2007-266570 A | 10/2007 |
| JP | 2009105268 A | 5/2009 |
| JP | 2009-206478 A | 9/2009 |
| JP | 2009-277792 A | 11/2009 |
| JP | 2010109033 A | 5/2010 |
| JP | 2010-238721 A | 10/2010 |
| JP | 2012-028567 A | 2/2012 |
| JP | 2013-084905 A | 5/2013 |
| JP | 2013161918 A | 8/2013 |
| JP | 2014-056942 A | 3/2014 |
| JP | 2014060387 A | 4/2014 |
| JP | 2014-158041 A | 8/2014 |
| JP | 2014-165364 A | 9/2014 |
| WO | 2012029652 A1 | 3/2012 |
| WO | 2012124056 A1 | 9/2012 |
| WO | 2013046377 A1 | 4/2013 |
| WO | 2014-168171 A1 | 10/2014 |

OTHER PUBLICATIONS

Office Action issued for counterpart Japanese Application 2017-528638, issued by the Japan Patent Office dated May 8, 2018.
Office Action issued for counterpart Japanese Application No. 2017-528638, drafted by the Japan Patent Office dated Oct. 19, 2018.

* cited by examiner

SEMICONDUCTOR DEVICE AND SEMICONDUCTOR DEVICE MANUFACTURING METHOD

The contents of the following Japanese patent applications are incorporated herein by reference:
NO. 2015-142184 filed in JP on Jul. 16, 2015, and
NO. PCT/JP2016/070103 filed on Jul. 7, 2016

BACKGROUND

1. Technical Field

The present invention relates to a semiconductor device and a semiconductor device manufacturing method.

2. Related Art

Conventionally, a structure of a semiconductor device is known in which an electrode of a gate or the like is formed in a trench provided in the front surface of the substrate, as shown in Patent Document 1, for example. Furthermore, a structure is known in which several of the trenches are dummy trenches having electrodes provided therein as emitter electrodes.
Patent Document 1: Japanese Patent Application Publication No. 2002-353456

A semiconductor device preferably has a structure that can easily be made finer.

SUMMARY

According to a first aspect of the present invention, provided is a semiconductor device comprising a semiconductor substrate; a gate trench portion formed in a front surface of the semiconductor substrate; a dummy trench portion formed in the front surface of the semiconductor substrate; and a first front-surface-side electrode that includes metal and is formed above the front surface of the semiconductor substrate, wherein the gate trench portion includes a gate trench formed in the front surface of the semiconductor substrate; a gate conducting portion formed inside the gate trench; and a gate insulating portion that is formed above the gate conducting portion inside the gate trench and provides insulation between the gate conducting portion and the first front-surface-side electrode. The dummy trench portion includes a dummy trench formed in the front surface of the semiconductor substrate; and a dummy conducting portion that is formed inside the dummy trench and contacts the first front-surface-side electrode.

The gate trench may be formed to a position deeper than the dummy trench.

Width of the gate trench may be greater than width of the dummy trench.

At least a portion of an end surface of the dummy conducting portion on an opening side of the dummy trench may be at the same height as the front surface of the semiconductor substrate. The first front-surface-side electrode may contact the end surface of the dummy conducting portion.

At least a portion of an end surface of the gate insulating portion on an opening side of the gate trench may be at the same height as the front surface of the semiconductor substrate. The first front-surface-side electrode may contact the end surface of the gate insulating portion.

The gate conducting portion and the dummy conducting portion may be formed of the same material.

The dummy trench portion may be formed extending in a predetermined extension direction in the front surface of the semiconductor substrate. The gate trench portion may include an opposing portion formed extending in the extension direction in a range opposite the dummy trench portion; and a protruding portion formed extending farther from the opposing portion and in a range that is not opposite the dummy trench portion. The semiconductor device may further comprise a second front-surface-side electrode formed above the protruding portion. The gate conducting portion in the protruding portion may be connected electrically to the second front-surface-side electrode.

In a portion of the protruding portion, the gate insulating portion is not provided and the gate conducting portion may contact the second front-surface-side electrode.

In the portion of the protruding portion, at least a portion of an end surface of the gate conducting portion on an opening side of the gate trench may be at the same height as the front surface of the semiconductor substrate. The second front-surface-side electrode may contact the end surface of the gate conducting portion.

The gate trench of the opposing portion may be formed to a position that is deeper than the gate trench of the portion of the protruding portion.

The gate trench of the portion of the protruding portion may be formed to a position at the same depth as the dummy trench.

The dummy trench portion may further include a dummy insulating portion formed above the dummy conducting portion inside the dummy trench. The dummy insulating portion may include a through-hole. A portion of the first front-surface-side electrode may pass through the through-hole of the dummy insulating portion and contacts the dummy conducting portion.

The portion of the first front-surface-side electrode passing through the through-hole may include tungsten.

The semiconductor device may further comprise a main transistor portion and a sense transistor portion. The gate trench portion and the dummy trench portion may be formed in at least one of the main transistor portion and the sense transistor portion.

According to a second aspect of the present invention, provided is a manufacturing method of a semiconductor device, comprising trench formation of forming a gate trench and a dummy trench in a front surface of a semiconductor substrate; conducting portion formation of forming a gate conducting portion inside the gate trench and forming a dummy conducting portion inside the dummy trench; insulating portion formation of forming a gate insulating portion above the gate conducting portion inside the gate trench; and electrode formation of forming a first front-surface-side electrode that includes metal above the front surface of the semiconductor substrate and in contact with the dummy conducting portion.

The trench formation may include forming the gate trench to be deeper than the dummy trench. The conducting portion formation may include forming the gate conducting portion and the dummy conducting portion in the same process.

The insulating portion formation may include forming an insulating film with a thickness greater than a distance in a depth direction between an end surface of the gate conducting portion and the front surface of the semiconductor substrate, on the front surface of the semiconductor substrate, and removing the insulating film formed farther above the front surface of the semiconductor substrate.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
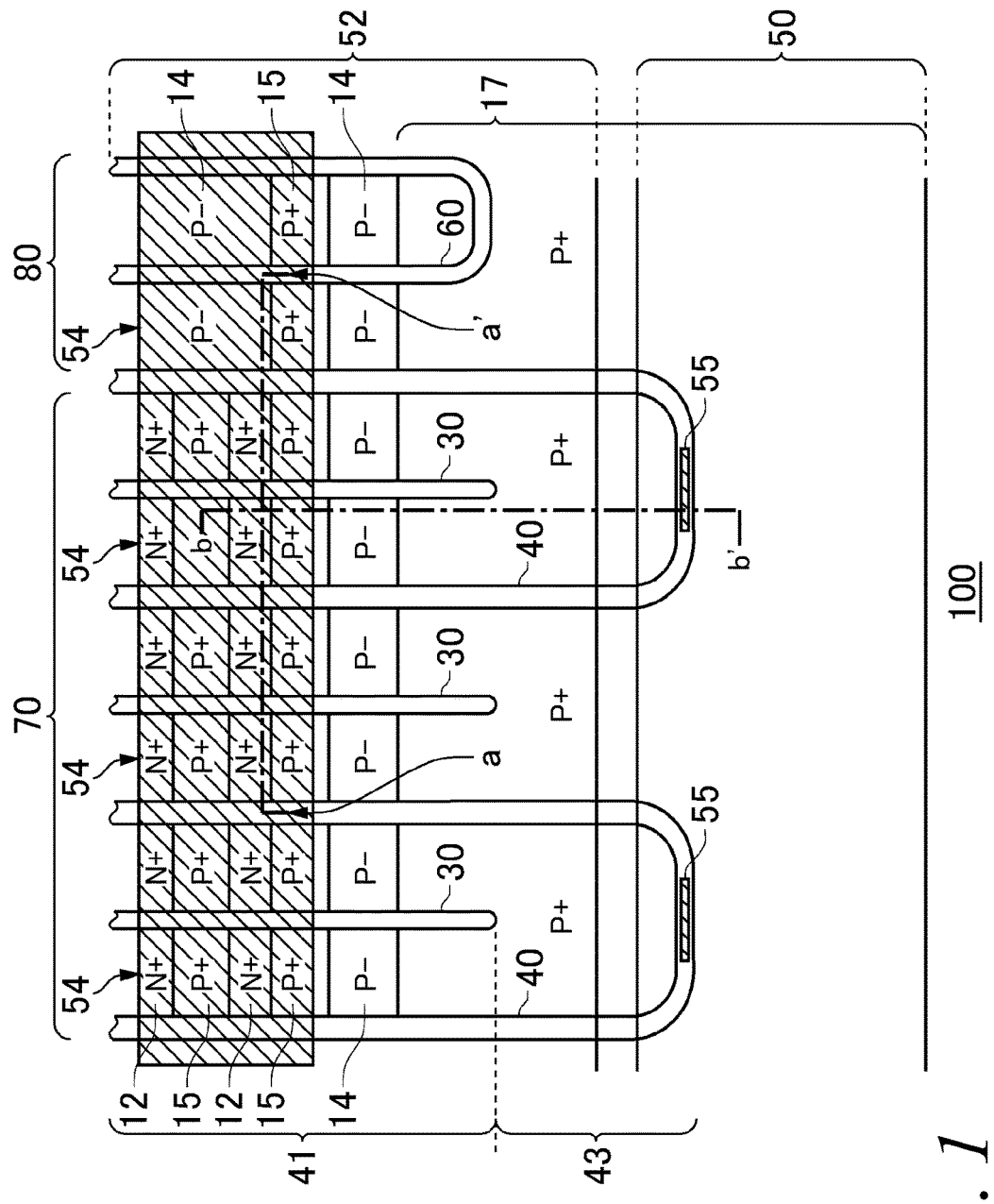
FIG. 1 is a planar view of an exemplary semiconductor device 100.

FIG. 1 is a planar view of an exemplary semiconductor device 100. The semiconductor device 100 of the present example is a semiconductor chip including a transistor portion 70 including a transistor such as an IGBT (Insulated Gate Bipolar Transistor) and a diode portion 80 including a diode such as an FWD (Free Wheel Diode). In FIG. 1, the front surface of the chip around the end portion of the chip is shown, and other regions are omitted.

The active region of the semiconductor substrate in the semiconductor device 100 is shown in FIG. 1, but the semiconductor device 100 may include an edge termination structure portion that surrounds the active region. The active region shows a region in which the current flows when the semiconductor device 100 is controlled to be in the ON state. The edge termination structure relaxes the electric field concentration on the front surface side of the semiconductor substrate. The edge termination structure includes a structure made from a guard ring, a field plate, a RESURF, and a combination thereof for example.

The semiconductor device 100 of the present example includes a gate electrode 50, an emitter electrode 52, a gate trench portion 40, a dummy trench portion 30, an emitter trench portion 60, a well region 17, an emitter region 12, a base region 14, a contact region 15, a contact hole 54, and a gate contact hole 55 on the front surface side of the chip. The emitter electrode 52 is one example of a first front-surface-side electrode, and the gate electrode 50 is an example of a second front-surface-side electrode.

The gate trench portion 40, the dummy trench portion 30, the emitter trench portion 60, the well region 17, the emitter region 12, the base region 14, and the contact region 15 are formed inside the semiconductor substrate in the front surface side, and the emitter electrode 52 and the gate electrode 50 are provided above the front surface of the semiconductor substrate.

An interlayer insulating film is formed between the front surface of the semiconductor substrate and the emitter electrode 52 and gate electrode 50, but this interlayer insulating film is omitted from FIG. 1. The contact hole 54 and the gate contact hole 55 are formed penetrating through the interlayer insulating film. The emitter electrode 52 passes through the contact hole 54 to contact the semiconductor substrate. The gate electrode 50 passes through the gate contact hole 55 to contact the semiconductor substrate.

The emitter electrode 52 and the gate electrode 50 are formed of a material containing metal. For example, at least a partial region of each electrode is formed of aluminum or an aluminum-silicon compound. Each electrode may include a barrier metal such as titanium or a titanium compound in the bottom layer, and may include a region formed by a material that includes a plug of buried tungsten between the aluminum and the barrier metal.

One or more gate trench portions 40 and one or more dummy trench portions 30 are arranged at prescribed intervals along a prescribed arrangement direction in a region of the transistor portion 70. The dummy trench portion 30 is formed extending in a predetermined extension direction in the front surface of the semiconductor substrate. The dummy trench portion 30 in the present example has a linear shape, and is formed extending in a direction perpendicular to the arrangement direction described above.

The gate trench portion 40 includes an opposing portion 41 and a protruding portion 43. The opposing portion 41 is formed extending in the extension direction described above, in a range opposite the dummy trench portion 30. In other words, the opposing portion 41 is formed parallel to the dummy trench portion 30. The protruding portion 43 extends farther from the opposing portion 41, and is formed in a range that is not opposite the dummy trench portion 30. In the present example, the two portions of the opposing portion 41 provided on the respective sides of the dummy trench portion 30 are connected by one protruding portion 43. At least a portion of the protruding portion 43 may have a curved shape.

A gate contact hole 55 is formed in the insulating layer covering the protruding portion 43. The gate contact hole 55 may be formed corresponding to a region distanced farthest from the opposing portion 41 in the protruding portion 43. The protruding portion 43 in the present example includes a portion that extends in a direction orthogonal to the opposing portion 41, in the region distanced farthest from the opposing portion 41. The gate contact hole 55 may be formed corresponding to this portion of the protruding portion 43.

The emitter trench portion 60 is provided in a region of the diode portion 80. The emitter trench portion 60 may have a shape similar to that of the gate trench portion 40. However, the length of the emitter trench portion 60 in the extension direction may be less than that of the gate trench portion 40. The length of the emitter trench portion 60 in the present example is the same as that of the dummy trench portion 30.

The gate electrode 50 is formed covering a portion of the protruding portion 43. The gate electrode 50 is formed covering a portion of the protruding portion 43 where the gate contact hole 55 is provided. The gate electrode 50 in the present example is not formed above the opposing portion 41, the dummy trench portion 30, and the emitter trench portion 60.

The emitter electrode 52 is formed above the gate trench portion 40, the dummy trench portion 30, the emitter trench portion 60, the well region 17, the emitter region 12, the base region 14, and the contact region 15. The emitter electrode 52 in the present example is formed covering a portion of the well region 17 and the gate trench portion 40.

The well region 17 is formed in a prescribed range from the end portion of the semiconductor substrate on the side where the gate electrode 50 is provided. The diffusion depth of the well region 17 may be greater than the depth of the gate trench portion 40, the dummy trench portion 30, and the emitter trench portion 60. A partial region on the gate electrode 50 side of the dummy trench portion 30, the emitter trench portion 60, and the opposing portion 41 is formed in the well region 17. The bottom of the end of the dummy trench portion 30 in the extension direction may be covered by the well region 17.

The entire protruding portion 43 may be formed in the well region 17. The semiconductor substrate has a first conduction type, and the well region 17 has a second conduction type that differs from the conduction type of the semiconductor substrate. The semiconductor substrate in the present example is (N−)-type, and the well region 17 is (P+)-type. In the description of the present example, the first conduction type is N-type and the second conduction type is P-type. However, the first and second conduction types may be opposite conduction types.

The base region 14 is formed in a region sandwiched by respective trench portions. The base region 14 has the second conduction type and a lower impurity concentration than the well region 17. The base region 14 in the present example is (P−)-type.

The contact region 15 has the second conduction type and a higher impurity concentration than the base region 14, and is formed on the front surface of the base region 14. The contact region 15 in the present example is (P+)-type. Furthermore, the emitter region 12 has the first conduction type and a higher impurity concentration than the semiconductor substrate, and is formed selectively on the transistor portion 70 in a portion of the front surface of the contact region 15. The emitter region 12 in the present example is (N+)-type.

The contact region 15 and the emitter region 12 are each formed from one of the adjacent trench portions to the other adjacent trench portion. One or more contact regions 15 and one or more emitter regions 12 of the transistor portion 70 are formed in regions sandwiched by respective trench portions, in a manner to be exposed in the front surface of the semiconductor substrate in an alternating manner along the extension direction of the trench portions.

In the transistor portion 70, the contact hole 54 is formed above each region including the contact region 15, the emitter region 12, and the dummy trench portion 30. In order to maximize the contact area between the emitter region 12 and the emitter electrode 52, the contact hole 54 is formed from one of the adjacent trench portions to the other adjacent trench portion. Furthermore, the contact hole 54 may be formed in a manner to expose the entire range of the front surface of the emitter region 12. Yet further, the contact hole 54 may be formed in a manner to expose the entire range of the front surface of the contact region 15. However, the contact hole 54 is not formed in a region corresponding to the base region 14 and the well region 17.

The contact hole 54 is also formed above the gate trench portion 40 in a range opposite the emitter region 12. The contact hole 54 in the present example exposes the gate trench portion 40 in a range opposite the emitter region 12 and the contact region 15. As described further below, an insulating portion providing insulation between the electrode in the trench and the emitter electrode 52 is formed at the top end in the trench of the gate trench portion 40.

The contact hole 54 is formed in a manner to expose the dummy trench portion 30 in a range opposite the emitter region 12. The contact hole 54 in the present embodiment exposes the dummy trench portion 30 in a range opposite the emitter region 12 and the contact region 15. The emitter electrode 52 contacts the electrode inside the exposed dummy trench portion 30.

In the diode portion 80, the contact hole 54 is formed above each region including the contact region 15, the base region 14, and the emitter trench portion 60. The contact hole 54 in the present example is not formed in the base region 14 that is closest to the gate electrode 50, among a plurality of the base regions 14. The contact hole 54 of the transistor portion 70 and the contact hole 54 of the diode portion 80 in the present example have the same length in the extension direction of each trench portion.

In the diode portion 80, in order to maximize the contact area between the emitter electrode 52 and the contact region 15 and base region 14, the contact hole 54 is formed from one of the adjacent trench portions to the other adjacent trench portion. However, the contact hole 54 is not formed in a region corresponding to the base region 14 and the well region 17. The contact hole 54 of the transistor portion 70 and the contact hole 54 of the diode portion 80 in the present example are formed integrally.

Figure 2:
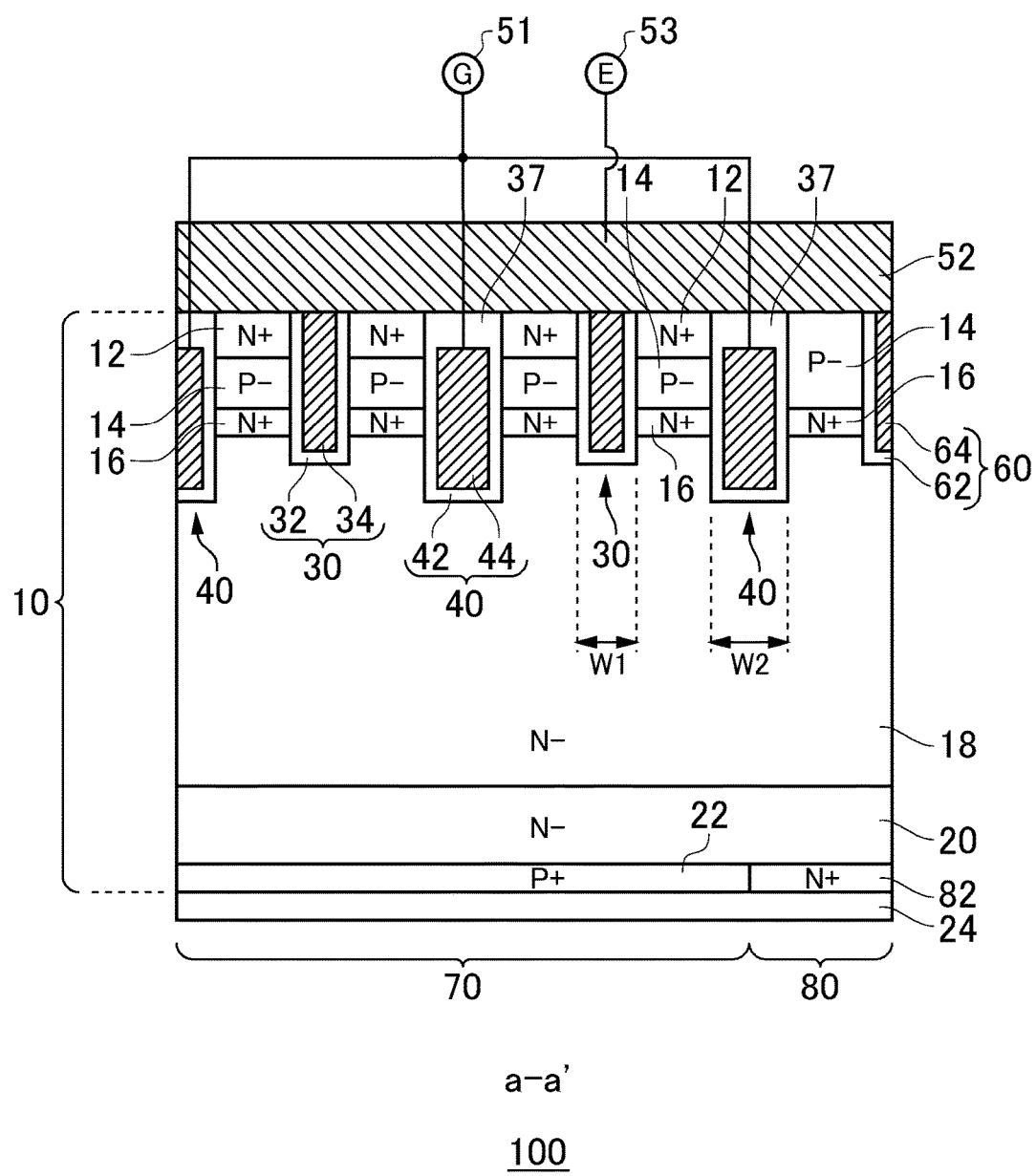
FIG. 2 shows an exemplary cross-section over the line a-a' in FIG. 1.

FIG. 2 shows an exemplary cross-section over the line a-a' in FIG. 1. The semiconductor device 100 in the present example includes the semiconductor substrate 10, the emitter electrode 52, and the collector electrode 24 in this cross section. The emitter electrode 52 is formed on the front surface of the semiconductor substrate 10. The emitter electrode 52 is electrically connected to the emitter terminal 53.

The collector electrode 24 is formed on the back surface of the semiconductor substrate 10. The collector electrode 24 is electrically connected to a collector terminal. The emitter electrode 52 and the collector electrode 24 are formed of a conductive material such as metal. In the present Specification, the surfaces on the emitter electrode 52 side of each portion including the substrate, the layers, the regions, and the like are referred to as the front surfaces, and the surfaces on the collector electrode 24 side of these portions are referred to as the back surfaces or bottom surfaces. Furthermore, a direction connecting the emitter electrode 52 and the collector electrode 24 is referred to as the depth direction.

The semiconductor substrate 10 may be a silicon substrate, and may be a silicon carbide substrate, a nitride semiconductor substrate, or the like. The (P−)-type base region 14 is formed on the front surface side of the semiconductor substrate 10. The (N+)-type emitter region 12 is formed selectively in a partial region on the front surface side of the base region 14.

The semiconductor substrate 10 further includes an (N+)-type accumulation region 16, an (N−)-type drift region 18, an (N−)-type buffer region 20, a (P+)-type collector region 22, and an (N+)-type cathode region 82. The accumulation region 16 is formed on the back surface side of the base region 14. The impurity concentration of the accumulation region 16 is higher than the impurity concentration of the drift region 18.

The accumulation region 16 is formed between adjacent trenches. For example, in the transistor portion 70, the accumulation region 16 is formed between the dummy trench portion 30 and the gate trench portion 40. The accumulation region 16 may be provided in a manner to cover the entire region between the dummy trench portion 30 and the gate trench portion 40. By providing the accumulation region 16, it is possible to increase the carrier injection enhancement effect (IE effect) and to reduce the ON voltage.

The drift region 18 is formed on the back surface side of the accumulation region 16. The buffer region 20 is formed on the back surface side of the drift region 18. The impurity concentration of the buffer region 20 is higher than the impurity concentration of the drift region 18. The buffer region 20 may function as a field stop layer that prevents the depletion layer expanding from the back surface side of the base region 14 from reaching the collector region 22 and the cathode region 82.

The collector region 22 is formed on the back surface side of the buffer region 20, in the region of the transistor portion 70. The cathode region 82 is formed on the back surface side of the buffer region 20, in the region of the diode portion 80. Furthermore, the collector electrode 24 is provided on the back surfaces of the collector region 22 and the cathode region 82.

One or more gate trench portions 40, one or more dummy trench portions 30, and one or more emitter trench portions 60 are formed in the front surface side of the semiconductor substrate 10. Each trench portion penetrates through the base region 14 from the front surface of the semiconductor substrate 10 and reaches the drift region 18. The gate trench portion 40 and the dummy trench portion 30 in the present example penetrate through the emitter region 12, the base region 14, and the accumulation region 16 from the front surface of the semiconductor substrate 10, and reach the drift region 18. Furthermore, the emitter trench portion 60 penetrates through the base region 14 and the accumulation region 16 from the front surface of the semiconductor substrate 10, and reaches the drift region 18.

The gate trench portion 40 includes a gate trench, an insulating film 42, a gate conducting portion 44, and a gate insulating portion 37 formed on the front surface side of the semiconductor substrate 10. The insulating film 42 is formed covering the inner walls of the gate trench. The insulating film 42 may be formed by oxidizing or nitriding the semiconductor material of the inner walls of the gate trench. The gate conducting portion 44 is formed farther inside within the gate trench than the insulating film 42. In other words, the insulating film 42 provides insulation between the gate conducting portion 44 and the semiconductor substrate 10. The gate conducting portion 44 is formed of a conductive material such as polysilicon.

The gate insulating portion 37 is formed above the gate conducting portion 44 inside the gate trench, and provides insulation between the gate conducting portion 44 and the emitter electrode 52. In the present example, the end surface of the gate conducting portion 44 on the gate trench opening side is provided farther inside the semiconductor substrate 10 than the front surface of the semiconductor substrate 10. Here, the front surface of the semiconductor substrate 10 may refer to the front surface of the emitter region 12. Furthermore, the end surface of the gate conducting portion 44 on the gate trench opening side may be referred to as the front surface of the gate conducting portion 44.

The gate insulating portion 37 fills the inside of the gate trench, above the front surface of gate conducting portion 44. The gate insulating portion 37 is provided covering the entire front surface of the gate conducting portion 44. At least a portion of the end surface of the gate insulating portion 37 on the gate trench opening side is provided at the same height as the front surface of the semiconductor substrate 10. The end surface of the gate insulating portion 37 on the gate trench side may be referred to as the front surface of the gate insulating portion 37.

The front surface of the gate insulating portion 37 contacts the emitter electrode 52. Other conductive materials or insulating materials are preferably not interposed between the gate insulating portion 37 and the emitter electrode 52. In this way, by forming the gate insulating portion 37 inside the gate trench, it is possible to reduce the unevenness of the front surface of the semiconductor substrate 10.

The entire front surface of the gate insulating portion 37 may be formed in the same plane as the front surface of the semiconductor substrate 10. In this case, it is possible to further reduce the unevenness of the front surface of the semiconductor substrate 10. Accordingly, the structure layered above the front surface of the semiconductor substrate 10 can be formed easily. Furthermore, it becomes easy to make the semiconductor device 100 finer.

The gate insulating portion 37 includes silicon oxide, silicon nitride, or other insulating materials, for example. The thickness of the gate insulating portion 37 in the depth direction may be greater than the thickness of the insulating film 42 at the bottom portion of the gate trench.

The gate conducting portion 44 includes at least a region opposite the base region 14 adjacent thereto. Each of a plurality of the gate conducting portions 44 is electrically connected to the gate terminal 51. In the present example, each gate conducting portion 44 is electrically connected to the gate electrode 50 at the protruding portion 43, as shown in FIG. 1. Furthermore, the gate electrode 50 is electrically connected to the gate terminal 51. When a prescribed voltage is applied to the gate conducting portions 44 via the gate terminal 51, a channel is formed in the front layer of interface contacting the gate trench in the base region 14.

The dummy trench portion 30 includes a dummy trench, an insulating film 32, and a dummy conducting portion 34 that are formed on the front surface side of the semiconductor substrate 10. The insulating film 32 is formed covering the inner walls of the dummy trench.

The dummy conducting portion 34 is formed inside the dummy trench, and is formed farther inward than the insulating film 32. The insulating film 32 provides insulation between the dummy conducting portion 34 and the semiconductor substrate 10. The dummy conducting portion 34 may be formed of the same material as the gate conducting portion 44. For example, the dummy conducting portion 34 is formed of a conductive material such as polysilicon. The dummy conducting portion 34 may have the same length as the gate conducting portion 44 in the depth direction.

The emitter electrode 52 contacts the dummy conducting portion 34 inside the dummy trench. The inside of the dummy trench includes the opening of the dummy trench. In other words, at least a portion of the end surface of the dummy conducting portion 34 on the dummy trench opening side is at the same height as the front surface of the semiconductor substrate 10, and the emitter electrode 52 may contact this end surface of the dummy conducting portion 34 at the same height as the front surface of the semiconductor substrate 10. The end surface of the dummy conducting portion 34 on the dummy trench opening side may be referred to as the front surface of the dummy conducting portion 34.

In the semiconductor device 100 of the present example, the dummy conducting portion 34 and the emitter electrode 52 directly contact each other. In other words, other conductive material such as polysilicon is not provided between the dummy conducting portion 34 and the emitter electrode 52. Therefore, it is possible to reduce the unevenness of the front surface of the semiconductor substrate 10. Furthermore, the entire front surface of the dummy conducting portion 34 may be at the same height as the front surface of the semiconductor substrate 10. In this case, it is possible to further reduce the unevenness of the front surface of the semiconductor substrate 10. Accordingly, it is possible to easily form the layered structure above the front surface of the semiconductor substrate 10.

The semiconductor device 100 does not need to include the insulating film on the front surface of the emitter region 12 in the mesa region between the gate trench portion 40 and the dummy trench portion 30. In other words, the front surfaces of all of the emitter regions 12 in the mesa region may contact the emitter electrode 52. If the insulating film is provided above the gate trench portion 40 and the dummy trench portion 30, this insulating film undesirably covers a portion of the front surface of the emitter region 12 in the mesa region. Furthermore, there are manufacturing variations in the size of the insulating film. Therefore, it is difficult to make the semiconductor device finer and reduce the mesa width. In contrast to this, with the semiconductor device 100, the insulating film does not need to be provided on the front surface of the emitter region 12 in the mesa region, and therefore it is possible to make the semiconductor device 100 finer.

The gate trench of the gate trench portion 40 may be formed to a position deeper than the dummy trench of the dummy trench portion 30. In this way, even when the gate conducting portion 44 and the dummy conducting portion 34 are formed to have the same length using the same process, it is possible to fill the dummy trench with the dummy conducting portion 34 while preserving the space in which the gate insulating portion 37 is to be provided inside the gate trench.

Furthermore, in the front surface side of the semiconductor substrate 10, the opening width W2 of the gate trench is greater than the opening width W1 of the dummy trench. Here, the opening width may refer to the maximum width of the opening. If the opening is circular, the opening width refers to the diameter of this circular shape. By making the opening width W2 of the gate trench larger, it is possible to make the length of the gate trench greater than the length of the dummy trench when the gate trench and the dummy trench are formed using the same etching process. Therefore, it is possible to easily form the gate trench and the dummy trench with different lengths.

Furthermore, in the example of FIG. 2, the front surface of the dummy conducting portion 34 is provided at the same position as the opening of the dummy trench. In another example, the front surface of the dummy conducting portion 34 may be provided at a deeper position inside the semiconductor substrate 10 than the opening of the dummy trench. In this case, the emitter electrode 52 is formed to the inside of the dummy trench, and contacts the front surface of the dummy conducting portion 34.

The insulating film 32 does not need to be formed near the end portion of the dummy trench on the substrate front surface side. In this way, at least a portion of the emitter region 12 is exposed in the side walls of the dummy trench. The insulating film 32 may be formed by oxidizing or nitriding a semiconductor of the inner walls of the dummy trench, forming the dummy conducting portion 34 with a prescribed thickness in the dummy trench, and then removing the oxide or nitride film that is not covered by the dummy conducting portion 34.

In this case, the emitter electrode 52 contacts the front surface of the dummy conducting portion 34 in the dummy trench and also contacts the emitter region 12 in the side walls of the dummy trench. Therefore, the contact area between the emitter region 12 and the emitter electrode 52 is expanded, and it is possible to reduce the contact resistance.

With the semiconductor device 100 of the present example, it is possible to increase the IE effect for the drift region and reduce the ON voltage, by providing the dummy trench portion 30. Furthermore, by providing the gate insulating portion 37 in the gate trench, it is possible to reduce the unevenness of the front surface of the semiconductor substrate 10. Yet further, by having the emitter electrode 52 and the dummy conducting portion 34 directly contact each other, it is possible to reduce the unevenness of the front surface of the semiconductor substrate 10. Therefore, the semiconductor device 100 can easily be made finer.

In the present example, the gate trench portions 40 and the dummy trench portions 30 are arranged in an alternating manner in a prescribed arrangement direction, as shown in FIG. 2. Furthermore, the trench portions may be arranged at constant intervals. It should be noted that the arrangement of each trench is not limited to the above example. A plurality of the gate trench portions 40 may be arranged between two dummy trench portions 30. Furthermore, the number of gate trench portions 40 provided between each set of dummy trench portions 30 does not need to be constant.

The diode portion 80 is provided in a region adjacent to the transistor portion 70. The diode portion 80 includes the base region 14, the accumulation region 16, the drift region 18, and the buffer region 20 in the same layer as the transistor portion 70. A cathode region 82 is provided on the back surface side of the buffer region 20 of the diode portion 80. The diode portion 80 includes one or more emitter trench portions 60. The emitter region 12 is not formed in the diode portion 80.

The emitter trench portion 60 is formed penetrating through the base region 14 and the accumulation region 16 from the front surface side of the base region 14, and reaches the drift region 18. Each emitter trench portion 60 includes an insulating film 62 and an emitter conducting portion 64, in the same manner as the dummy trench portion 30. The emitter trench portion 60 may have the same structure as the dummy trench portion 30.

Specifically, the front surface of the emitter conducting portion 64 contacts the emitter electrode 52. Furthermore, the emitter trench of the emitter trench portion 60 may be formed to be shallower than the gate trench of the gate trench portion 40. The width of the emitter trench may be less than the width of the gate trench.

In the present example, the intervals between the trench portions in the transistor portion 70 are the same as the intervals between the emitter trench portions 60 in the diode portion 80. As shown in FIG. 2, when the gate trench portions 40 and the dummy trench portions 30 are arranged in an alternating manner in the transistor portion 70, the intervals between the gate trench portions 40 and the dummy trench portions 30 may be the same as the intervals between the emitter trench portions 60.

Figure 3:
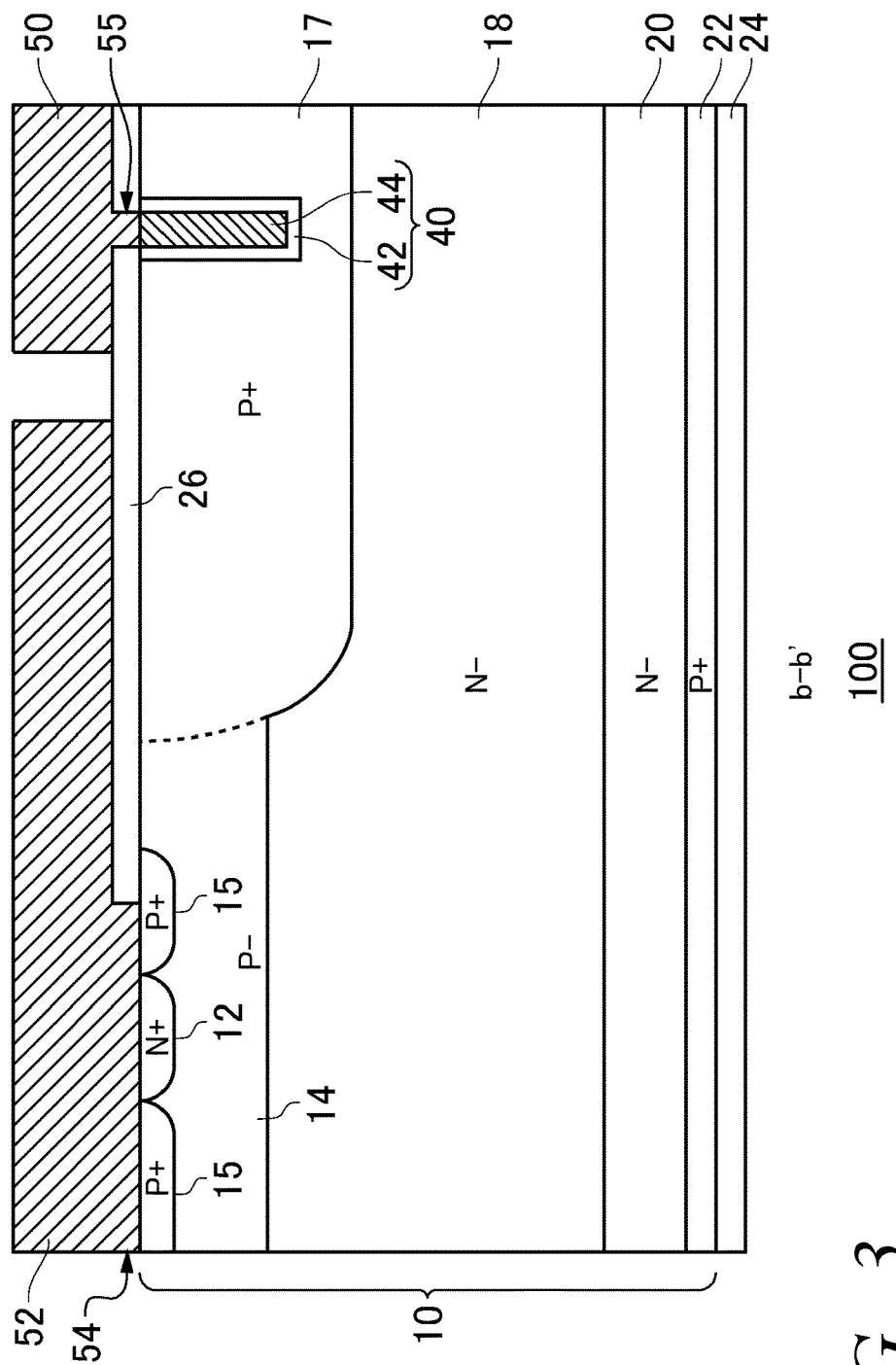
FIG. 3 shows an exemplary cross-section over the line b-b' in FIG. 1.

FIG. 3 shows an exemplary cross-section over the line b-b' in FIG. 1. The semiconductor device 100 of the present example includes the semiconductor substrate 10, the interlayer insulating film 26, the emitter electrode 52, and the collector electrode 24 in this cross section. The interlayer insulating film 26 is formed between the semiconductor substrate 10 and the gate electrode 50 and emitter electrode 52. A contact hole 54 and a gate contact hole 55 are formed in the interlayer insulating film 26.

The contact hole 54 exposes at least a portion of the emitter region 12 and the contact region 15 in the front surface of the semiconductor substrate 10. The emitter electrode 52 passes through the contact hole 54 to contact the emitter region 12 and the contact region 15.

The gate contact hole 55 exposes at least a portion of the protruding portion 43 of the gate trench portion 40 on the front surface of the semiconductor substrate 10. In the present example, the gate insulating portion 37 is not formed on the gate trench portion 40 exposed by the gate contact hole 55. In other words, at least a portion of the front surface of the gate conducting portion 44 is exposed by the gate contact hole 55. The gate electrode 50 passes through the gate contact hole 55 to contact the front surface of the gate conducting portion 44.

The gate trench portion 40 exposed by the gate contact hole 55 may have the same structure as the dummy trench portion 30 shown in FIG. 2. For example, at least a portion of the end surface of the gate conducting portion 44 on the gate trench opening side (the front surface in the present example) is at the same height as the front surface of the semiconductor substrate 10 in a portion of the protruding portion 43. The entire front surface of the gate conducting portion 44 may be at the same height as the front surface of the semiconductor substrate 10.

Furthermore, the gate trench of the gate trench portion 40 exposed by the gate contact hole 55 may be shallower than the gate trench of the gate trench portion 40 in the opposing portion 41. In other words, the gate trench of the opposing portion 41 is deeper than some of the gate trenches of the protruding portion. The gate trench of the gate trench portion 40 exposed by the gate contact hole 55 may be formed to the same depth as the dummy trench. The gate trench of the gate trench portion 40 exposed by the gate contact hole 55 may have the same width as the dummy trench. With this configuration, the unevenness of the front surface of the semiconductor substrate 10 can be reduced.

Figure 4:
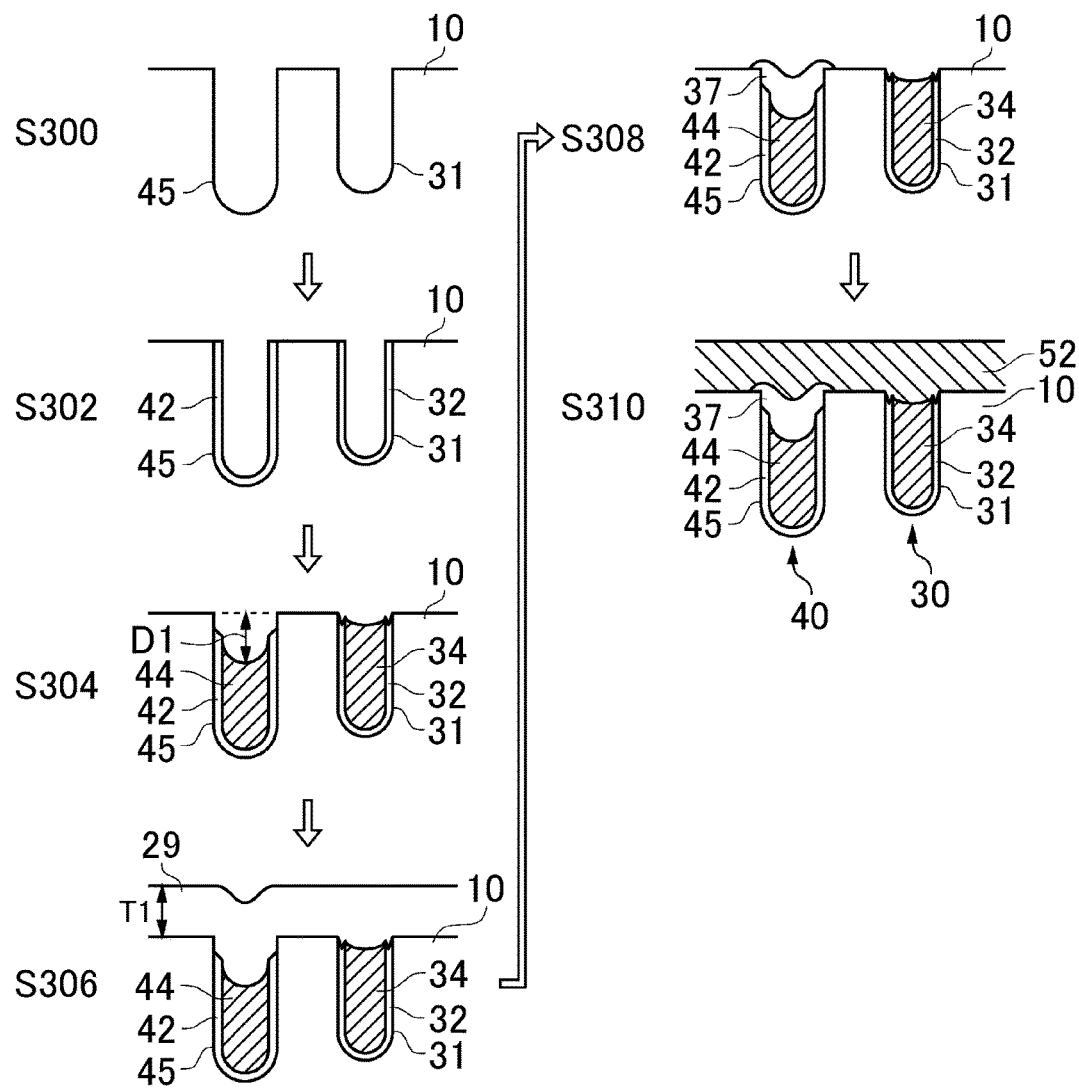
FIG. 4 is a drawing for describing an exemplary manufacturing method of the semiconductor device 100.

FIG. 4 is a drawing for describing an exemplary manufacturing method of the semiconductor device 100. FIG. 4 shows the process of forming the gate trench portion 40 and the dummy trench portion 30, in the manufacturing process. It should be noted that the semiconductor device 100 manufacturing method is not limited to the present example. First, the semiconductor substrate 10 having the same conduction type as the drift region 18 (described as (N−)-type in the present example) is prepared.

Next, at the trench formation stage S300, an etching mask with a prescribed pattern is provided on the front surface of the semiconductor substrate 10, and the gate trench 45 and the dummy trench 31 are formed. The gate trench 45 may be formed to a deeper position than the dummy trench 31. In this case, by making the width of the mask opening for forming the gate trench 45 larger than the width of the mask opening for forming the dummy trench 31, it is possible to form the gate trench 45 and the dummy trench 31 to different depths using the same process. Next, at the insulating film formation stage S302, the insulating film 42 and the insulating film 32 are formed on the inner walls of the gate trench 45 and the dummy trench 31.

Next, at the conducting portion formation stage S304, the insides of the gate trench 45 and the dummy trench 31 are filled with conductive material, thereby forming the gate conducting portion 44 and the dummy conducting portion 34. The gate conducting portion 44 and the dummy conducting portion 34 having the same length are formed in the same process. In the present example, the dummy conducting portion 34 fills the entire dummy trench 31. It should be noted that the top surface of the dummy conducting portion 34 is slightly depressed toward the inside of the substrate into a concave shape, in the same manner as the gate conducting portion 44, due to over-etching of the conductive material such as polysilicon. Furthermore, a gate insulating film 42 is also slightly etched when performing the etching to make the conductive material even deeper than the front surface of the semiconductor substrate 10. Here, "slightly" is an amount determined by the etching selectivity ratio between the gate insulating film 42 and the conductive material forming the gate conducting portion 44. In this way, there are cases where the top end of the gate insulating film 42 is provided at a position deeper than the front surface of the semiconductor substrate 10. In this case, the semiconductor substrate 10 is exposed in the side walls of the gate trench 45 in the portion above the top end of the gate insulating film 42. Since the gate trench 45 is deeper than the dummy trench 31, a space with a depth D1 remains near the top end inside the gate trench 45. The depth D1 refers to the distance in the depth direction between the front surface of the semiconductor substrate 10 and the portion of the front surface of the gate conducting portion 44 that is at the deepest position.

Next, P-type impurities are implanted from the front surface side of the semiconductor substrate, thermal processing is performed at a temperature of approximately 1100° C. for approximately 2 hours to form the P-type base region 14 that is shallower than the trench, in the entire front surface of the semiconductor substrate 10. Next, N-type impurities are implanted from the front surface side of the semiconductor substrate 10 to form the N-type accumulation region 16 that is deeper than the base region 14 and shallower than the trench. For example, the N-type accumulation region 16 is formed by ion-implanting phosphorous with an acceleration voltage of approximately 2.8 MeV and a concentration of $5.0 \times 10^{12}/cm^2$.

Next, N-type impurities are selectively implanted from the front surface side of the semiconductor substrate 10, using a mask in which portions corresponding to the emitter region 12 are open. In this way, the (N+)-type emitter region 12 is selectively formed inside the P-type base region 14.

Next, at the insulating film formation step S306, the insulating film 29 is formed on the front surface of the semiconductor substrate 10. The thickness T1 of the insulating film 29 is preferably greater than the depth D1 of the space inside the gate trench 45. Furthermore, the insulating film 29 may directly contact the semiconductor substrate 10 at the side walls of the gate trench. In this way, it is possible to prevent a widely known bird's beak from forming on the top surface of the gate insulating film of the side walls of the gate trench.

Next, at the insulating film removal step S308, the insulating film is removed while leaving behind a prescribed inter-layer insulating pattern. At this time, the insulating film is removed such that the insulating film remains inside the gate trench 45. In this way, the interlayer insulating film 26 and the gate insulating portion 37 are formed. At S308, the insulating film may be polished down to the same height as the front surface of the semiconductor substrate 10 using CMP. In this case, the entire front surface of the gate insulating portion 37 becomes the same height as the front surface of the semiconductor substrate 10.

Furthermore, at S308, the insulating film may be removed by etching. At this time, as shown in FIG. 4, there are cases where a portion of the gate insulating portion 37 is also formed on the front surface of the semiconductor substrate 10 near the edge of the opening of the gate trench 45. In this case, the gate insulating portion 37 is provided in a manner to cover the end surface of the insulating film 42, and can function as a protective section that protects the insulating film 42. It should be noted that, in order to minimize the unevenness in the front surface of the semiconductor substrate 10, at least a portion of the front surface of the gate insulating portion 37 is preferably provided at the same height as the front surface of the semiconductor substrate 10.

Next, at the electrode formation step S310, the emitter electrode 52 including metal is formed on the front surface of the semiconductor substrate 10. The emitter electrode 52 contacts the front surface of the dummy conducting portion 34. Furthermore, the emitter electrode 52 contacts both the front surface of the gate insulating portion 37 and the emitter region 12. In this way, it is possible to form the structure of the trenches, electrodes, and the like on the front surface side of the semiconductor substrate 10.

Next, selenium is ion-implanted with a concentration of approximately $1.0 \times 10^{14}/cm^2$, for example, from the back surface side of the semiconductor substrate 10, and then thermal processing is performed at a temperature of approximately 900° C. for approximately 2 hours. In this way, the (N+)-type buffer region 20 is formed on the back surface side of the semiconductor substrate 10. The remaining (N−)-type region of the semiconductor substrate 10 becomes the drift region 18. By using selenium, which has a large diffusion coefficient, it is possible to form the buffer region 20 at a deep position. Furthermore, before forming the buffer region 20, the semiconductor substrate 10 may be polished to adjust the thickness thereof.

Instead of ion-implanting selenium, the (N+)-type buffer region 20 may be formed by ion-implanting protons a plurality of times with different dose amounts. In this way, it is possible to form the buffer region 20 with an impurity concentration that increases from the front surface side of the substrate toward the back surface side of the substrate.

Next, P-type impurities are ion-implanted from the back surface side of the semiconductor substrate 10 with a does amount that is greater than or equal to $1.0 \times 10^{13}/cm^2$ and less than or equal to $4.0 \times 10^{13}/cm^2$. In this way, the (P+)-type collector region 22 that is thinner than the buffer region 20 is formed on the back surface side of the semiconductor substrate 10. If the dose amount of the P-type impurities is less than $1.0 \times 10^{13}/cm^2$, ohmic contact cannot be realized between the collector region and the collector electrode, and therefore such a dose amount is undesirable. Furthermore, the cathode region 82 is formed in the diode portion 80. The collector electrode 24 and the like are then formed as desired on the back surface side of the semiconductor substrate 10.

Figure 5:
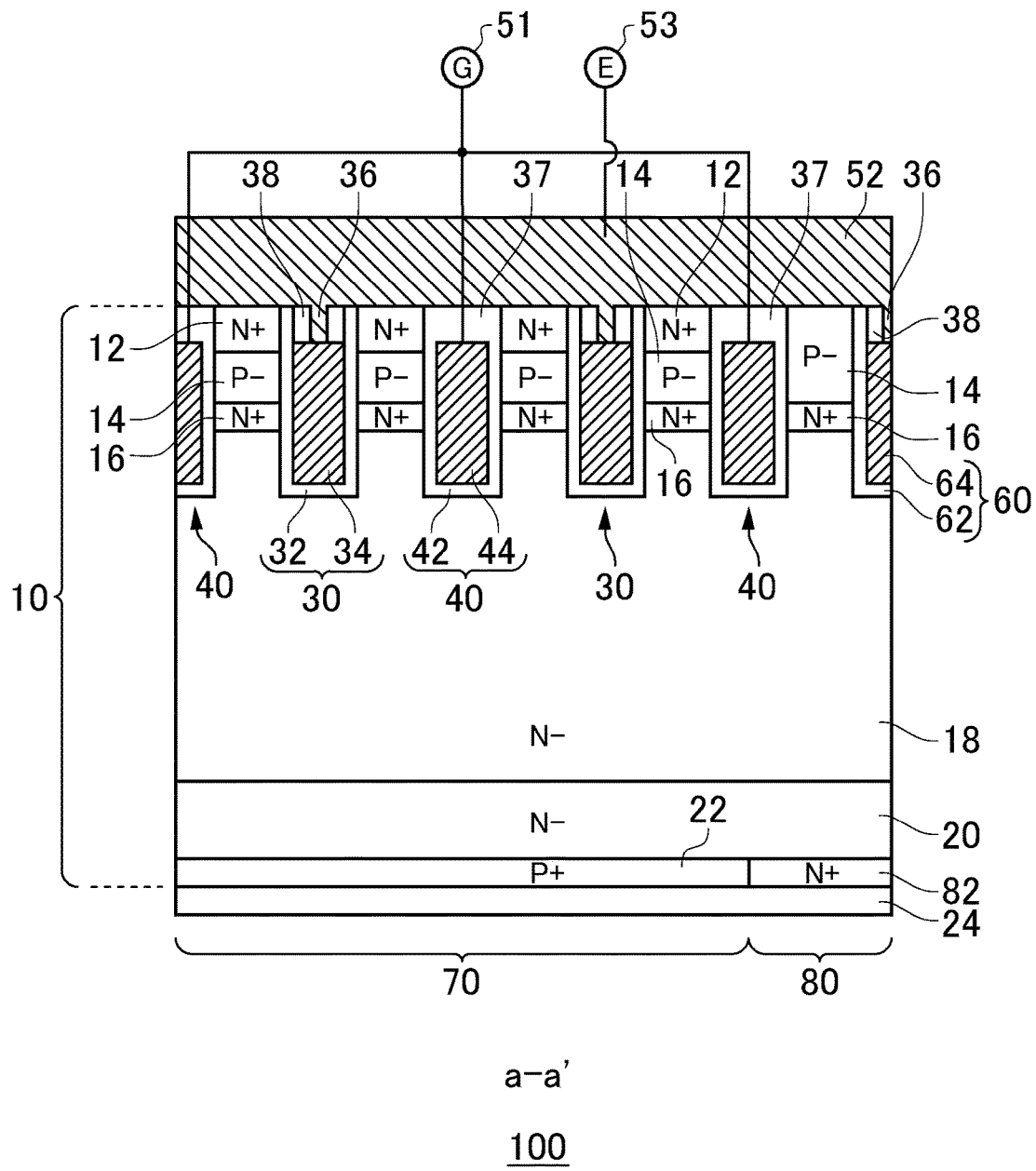
FIG. 5 shows another exemplary structure of the semiconductor device 100 in the cross section over the line a-a'.

FIG. 5 shows another exemplary structure of the semiconductor device 100 in the cross section over the line a-a'. The dummy trench portion 30 in the present example further includes a dummy insulating portion 38 in the configuration of the dummy trench portion 30 described in FIGS. 1 to 4. The dummy conducting portion 34 is formed from the bottom portion of the dummy trench to a middle portion of the dummy trench. The dummy insulating portion 38 is formed above the dummy conducting portion 34 inside the dummy trench.

The dummy insulating portion 38 includes a through-hole 36. A portion of the emitter electrode 52 passes through the through-hole 36 of the dummy insulating portion 38 and contacts the front surface of the dummy conducting portion 34. The emitter electrode 52 may include a plug portion provided inside the through-hole 36. The plug portion may be formed of the same material as the region of the emitter electrode 52 formed above the front surface of the semiconductor substrate 10, or may be formed of a different material. As an example, the plug portion is formed of a material including tungsten, and the portions of the emitter electrode 52 other than the plug portion is formed of a material that does not include tungsten. By forming the plug portion with a material including tungsten, it is possible to easily form the plug portion inside the fine through-hole 36 as well.

At least a portion of the front surface of the dummy insulating portion 38 is provided at the same height as the front surface of the semiconductor substrate 10. The entire front surface of the dummy insulating portion 38 may be provided at the same height as the front surface of the semiconductor substrate 10. With this configuration as well, it is possible to reduce the unevenness of the front surface of the semiconductor substrate 10.

The dummy trench portion 30 in the present example may have the same shape as the gate trench portion 40, aside from the through-hole 36. The depth and width of the dummy trench may be the same as the depth and width of the gate trench. The dummy conducting portion 34 may have a length in the depth direction that is the same as that of the gate conducting portion 44. The gate insulating portion 37 may have a length in the depth direction that is the same as that of the dummy insulating portion 38. The dummy insulating portion 38 may be formed using the same process as used for the gate insulating portion 37.

Figure 6:
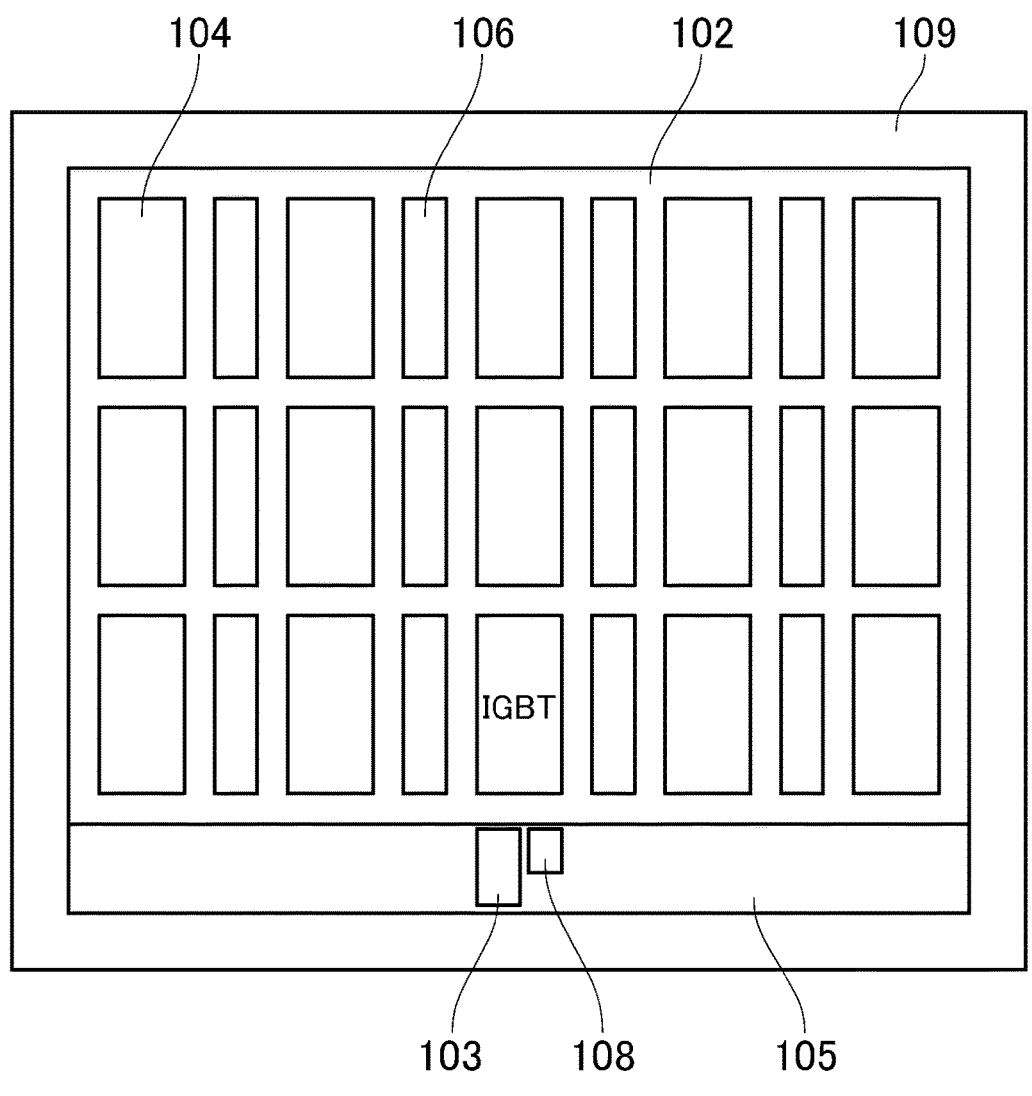
FIG. 6 shows an exemplary front surface arrangement of the semiconductor device 100.

FIG. 6 shows an exemplary front surface arrangement of the semiconductor device 100. The semiconductor device 100 includes an active region 102 and an outer region 105. The active region 102 is a region where current flows when the semiconductor device 100 is driven, for example. A plurality of main transistor portions 104 and diode portions 106 are included in the active region 102. The main transistor portion 104 may include the transistor portion 70. The diode portion 106 includes the diode portion 80.

The plurality of main transistor portions 104 are provided in parallel, and each have the same potential applied to the gate, emitter, and collector terminals thereof. The plurality of diode portions 106 are provided in parallel, and each have the same potential applied to the emitter (anode) and cathode terminals thereof.

The main transistor portions 104 and the diode portions 106 may be arranged in an alternating manner along a prescribed arrangement direction. The plurality of main transistor portions 104 may be arranged in a direction orthogonal to the arrangement direction described above. The plurality of diode portions 106 may be arranged in the direction orthogonal to the arrangement direction described above. A gate runner that transmits the gate potential may be provided between two main transistor portions 104 and between two diode portions 106.

The outer region 105 is provided outside of the active region 102. The outside of the active region 102 refers to a region that is not surrounded by the active region 102 and that is nearer the end portion of the semiconductor substrate 10 than the center of the active region 102. The outer region 105 may surround the active region 102. An edge termination structure portion 109 and the like may be provided farther outside the outer region 105. Furthermore, the well region 17 of the active region 102 and the well region of the outer region 105 are separated from each other.

A sense transistor portion 108 may be provided in the active region 102. The sense transistor portion 108 detects the current flowing through the main transistor portion 104. For example, a current that is smaller than the main current flowing through the main transistor portion 104 and also proportional to the main current flows through the sense transistor portion 108. As an example, the sense transistor portion 108 is connected in parallel with the main transistor portion 104, and has the same gate potential input thereto. It should be noted that a resistance that is greater than the resistance connected to the main transistor portion 104 is connected to the sense transistor portion 108.

The gate trench portion 40 and the dummy trench portion 30 described in FIGS. 1 to 5 are formed in at least one of the main transistor portion 104 and the sense transistor portion 108. The gate trench portion 40 and the dummy trench portion 30 described in FIGS. 1 to 5 may be formed in the main transistor portion 104, and do not need to be formed in the sense transistor portion 108. The gate trench portion 40 and the dummy trench portion 30 described in FIGS. 1 to 5 are preferably formed in both the main transistor portion 104 and the sense transistor portion 108.

A gate pad 103 may be formed adjacent to the sense transistor portion 108. The gate pad 103 may function as a gate terminal 51. The area of the gate pad 103 may be greater than the area of the sense transistor portion 108. The gate pad 103 and the sense transistor portion 108 are both provided at positions opposite the main transistor portion 104.

Figure 7:
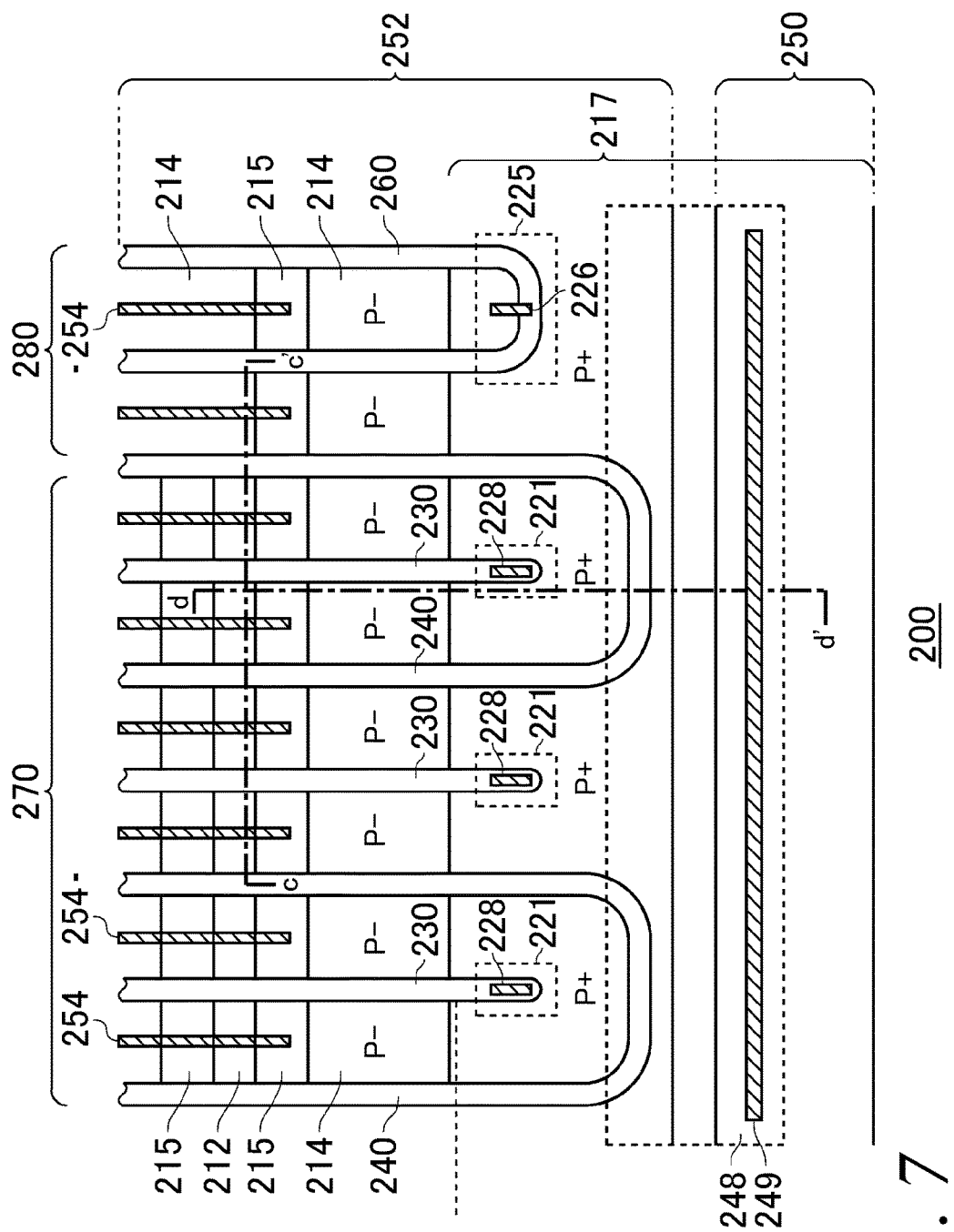
FIG. 7 shows a configuration of a semiconductor device 200 according to a comparative example.

FIG. 7 shows a configuration of a semiconductor device 200 according to a comparative example. The semiconductor device 200 includes a transistor portion 270 and a diode portion 280. A gate electrode 250, an emitter electrode 252, a gate trench portion 240, a dummy trench portion 230, an emitter trench portion 260, a well region 217, an emitter region 212, a base region 214, a contact region 215, contact holes 226, 228, 249, and 254, and polysilicon layers 221, 225, and 248 are included on the front surface side of the semiconductor device 200.

Figure 8:
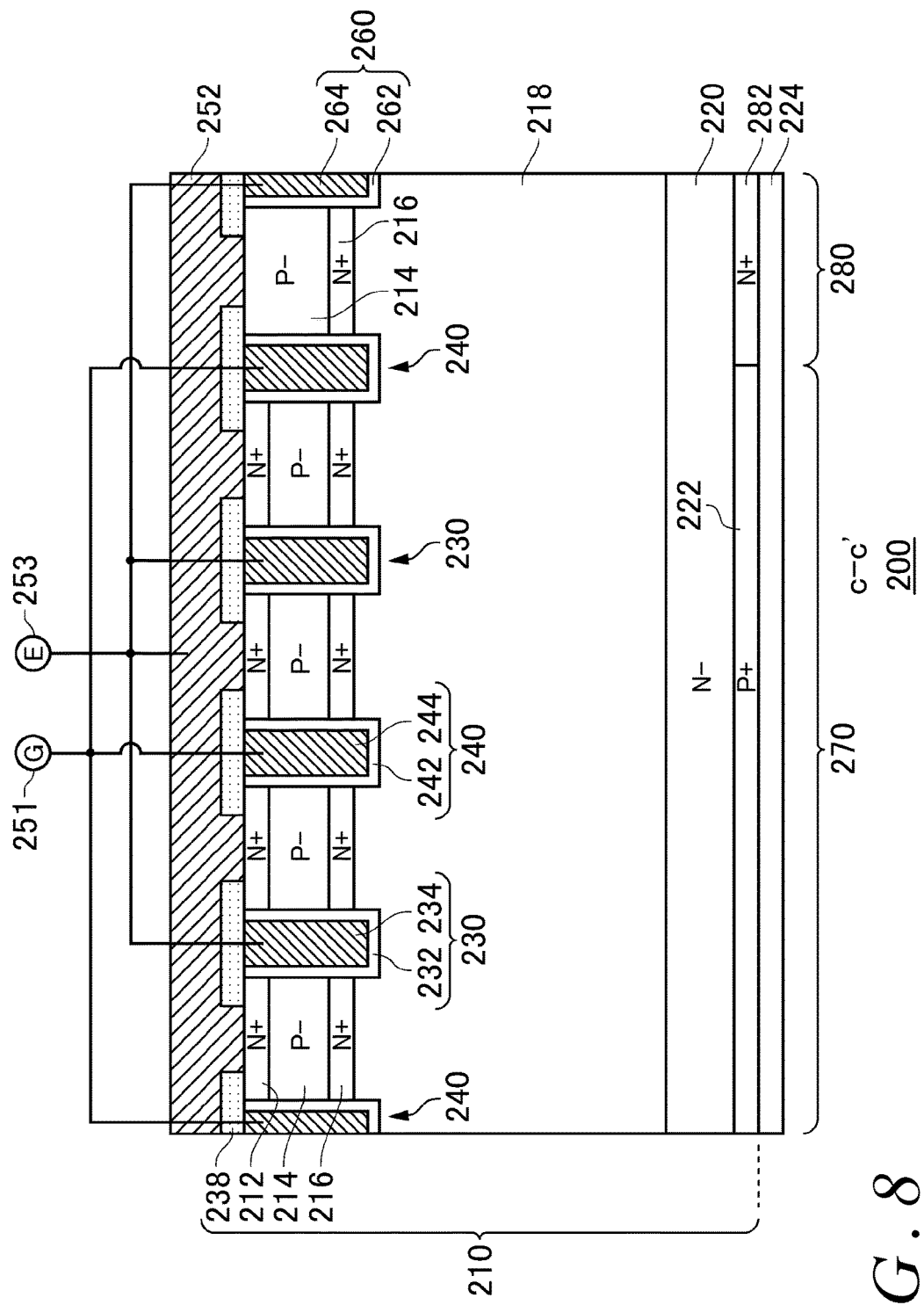
FIG. 8 shows the cross section over the line c-c' in FIG. 7.

FIG. 8 shows the cross section over the line c-c' in FIG. 7. The semiconductor device 200 includes a semiconductor substrate 210, an emitter electrode 252, an insulating portion 238, and a collector electrode 224 in this cross section. The emitter electrode 252 is electrically connected to the emitter terminal 253.

The gate trench portion 240, the dummy trench portion 230, the emitter trench portion 260, the emitter region 212, the base region 214, the accumulation region 216, the drift region 218, the buffer region 220, the collector region 222, and the cathode region 282 are formed in the semiconductor substrate 210. The gate trench portion 240 includes the insulating film 242 and the gate conducting portion 244. The gate conducting portion 244 is electrically connected to the gate terminal 251. The dummy trench portion 230 includes the insulating film 232 and the dummy conducting portion 234. The emitter trench portion 260 includes the insulating film 262 and the emitter conducting portion 264.

The insulating portion 238 is provided covering each of the gate trench portion 240, the dummy trench portion 230, and the emitter trench portion 60 on the front surface of the semiconductor substrate 10. It should be noted that the insulating portion 238 exposes at least a portion of the front surface of the emitter region 212 in the mesa region between the gate trench portion 240 and the dummy trench portion 230. The emitter electrode 252 contacts the front surface of this emitter region 212.

The area of the emitter region 212 not covered by the insulating portion 238 changes due to manufacturing variations in the insulating portion 238. Therefore, the manufacturing variations in the insulating portion 238 must be considered to expose at least a portion of the emitter region 212. In particular, in the present example, the insulating portion 238 is formed on both sides of the mesa region, and therefore the width of the mesa region is affected by the variations in the insulating portion 238 on both sides thereof. Therefore, it is difficult to reliably expose the emitter region 212 when the semiconductor device 200 is made finer, and so it is difficult to make the semiconductor device 200 finer. In contrast to this, with the semiconductor device 100, the insulating film is not provided covering the gate trench portion 40 and the dummy trench portion 30 on the front surface of the semiconductor substrate 10, and therefore it is possible for the emitter region 12 and the emitter electrode 52 to contact each other even when the semiconductor device 100 is made finer.

Furthermore, in the semiconductor device 200, the insulating portion 238 is patterned on the front surface of the semiconductor substrate 210. Therefore, the front surface of the semiconductor substrate 210 is formed unevenly. In contrast to this, the semiconductor device 100 does not have the insulating portion 238 provided on the front surface of the semiconductor substrate 10, and therefore it is possible to reduce the unevenness of the front surface of the semiconductor substrate 10.

Figure 9:
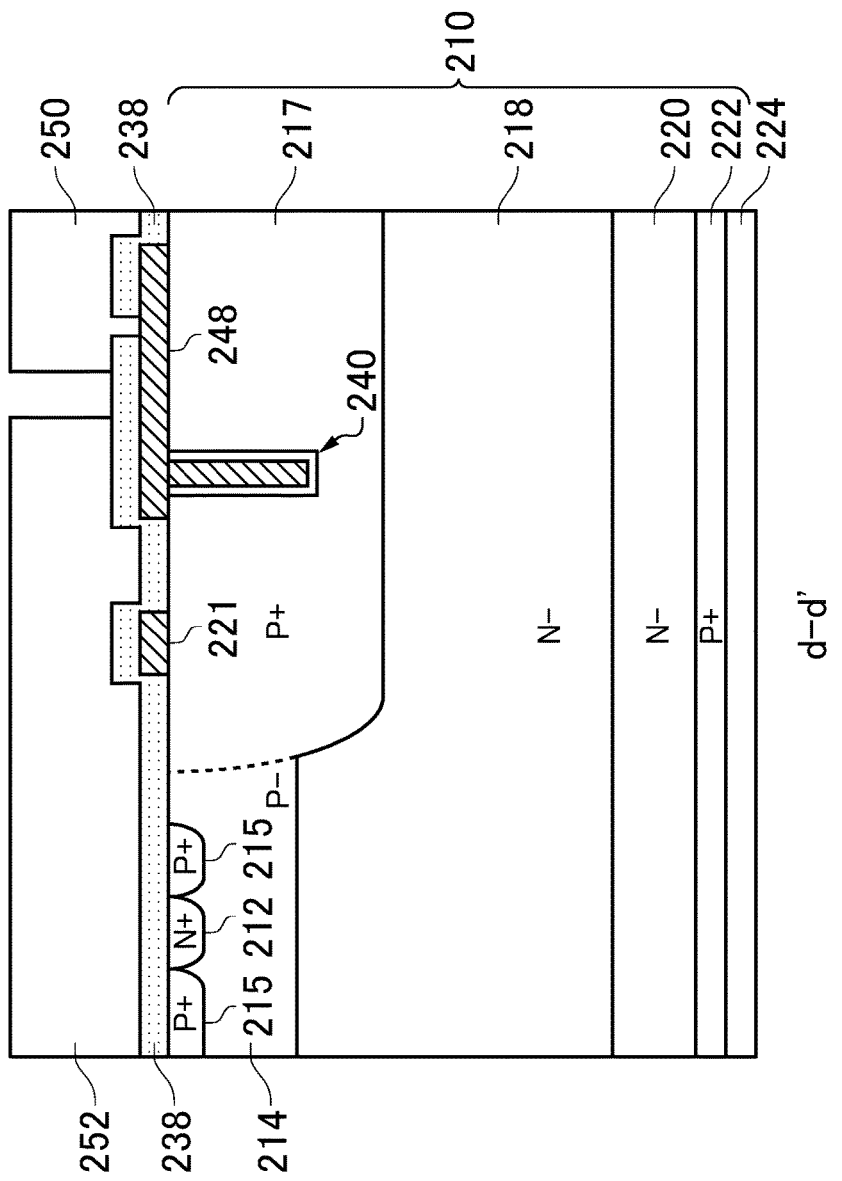
FIG. 9 shows the cross section over the line d-d' in FIG. 7.

FIG. 9 shows a cross section over the line d-d' in FIG. 7. The semiconductor device 200 includes the semiconductor substrate 210, the emitter electrode 252, the gate electrode 250, the collector electrode 224, the polysilicon layer 221, the polysilicon layer 248, and the insulating portion 238 in this cross section.

The polysilicon layer 221 and the polysilicon layer 248 are formed on the front surface of the semiconductor substrate 210, and contact the conducting portion in each trench and the emitter electrode 252 or gate electrode 250. The semiconductor device 200 includes the polysilicon layer 221 and the polysilicon layer 248 selectively formed on the front surface of the semiconductor substrate 210. Therefore, unevenness occurs in the front surface of the semiconductor substrate 210, and it is not easy to form the layers that are to be formed above the front surface of the semiconductor substrate 210, such as the insulating portion 238.

In contrast to this, with the semiconductor device 100, the emitter electrode 52 and the gate electrode 50 do not directly contact the conducting portions in each trench, and therefore the polysilicon layer does not need to be provided on the front surface of the semiconductor substrate 10. Therefore, it is possible to reduce the unevenness of the front surface of the semiconductor substrate 10.

Figure 10:
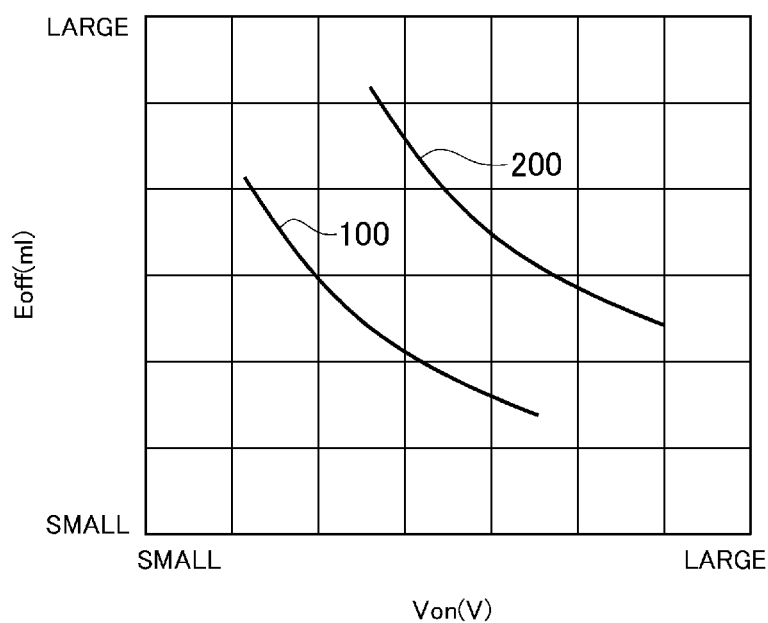
FIG. 10 shows the relationship between the ON voltage Von and the turn-OFF loss Eoff.

FIG. 10 shows the relationship between the ON voltage Von and the turn-OFF loss Eoff. The turn-OFF loss Eoff occurring when the ON voltage Von is changed is shown for each of the semiconductor device 100 and the semiconductor device 200. As shown in each example, there is a tradeoff relationship between the ON voltage Von and the turn-OFF loss Eoff.

It is difficult to make the semiconductor device 200 described above finer when considering the manufacturing variations in the insulating portion 238. Therefore, the width of the mesa region (the distance between the gate trench portion 40 and the dummy trench portion 30) of the semiconductor device 200 in FIG. 10 is approximately 1 μm. In contrast to this, the semiconductor device 100 does not include the insulating portion 238, and therefore can easily be made finer. The width of the mesa region of the semiconductor device 100 in FIG. 10 is approximately 0.3 μm. Therefore, the semiconductor device 100 can realize a decrease in the ON resistance and improve the Von-Eoff relationship.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

In the Specification and the Claims, terms such as "up" and "above" refer to directions that are the opposite of the directions indicated by terms such as "down" and "below." However, the terms such as "up" and "above" are not limited to the direction opposite the direction of gravity. Furthermore, the terms such as "down" and "below" are not limited to the direction of gravity. For example, in a semiconductor device mounted in an electrical device, when the gate electrode and the like are arranged in the front surface on the ground side of the semiconductor substrate, it is clear that this semiconductor device is contained in the scope of the present invention.

LIST OF REFERENCE NUMERALS

10: semiconductor substrate, 12: emitter region, 14: base region, 15: contact region, 16: accumulation region, 17: well region, 18: drift region, 20: buffer region, 22: collector region, 24: collector electrode, 26: interlayer insulating film, 29: insulating film, 34: dummy conducting portion, 36: through-hole, 37: gate insulating portion, 38: dummy insulating portion, 40: gate trench portion, 41: opposing portion, 42: insulating film, 43: protruding portion, 44: gate conducting portion, 45: gate trench, 50: gate electrode, 51: gate terminal, 52: emitter electrode, 53: emitter terminal, 54: contact hole, 55: gate contact hole, 60: emitter trench portion, 62: insulating film, 64: emitter conducting portion, 70: transistor portion, 80: diode portion, 82: cathode region, 100: semiconductor device, 102: active region, 103: gate pad, 104: main transistor portion, 105: outer region, 106: diode portion, 108: sense transistor portion, 109: edge termination structure portion, 200: semiconductor device, 210: semiconductor substrate, 212: emitter region, 214: base region, 215: contact region, 216: accumulation region, 217: well region, 218: drift region, 220: buffer region, 221: polysilicon layer, 222: collector region, 224: collector electrode, 225: polysilicon layer, 226: contact hole, 228: contact hole, 230: dummy trench portion, 232: insulating film, 234: dummy conducting portion, 238: insulating portion, 240: gate trench portion, 242: insulating film, 244: gate conducting portion, 248: polysilicon layer, 249: contact hole, 250: gate electrode, 251: gate terminal, 252: emitter electrode, 253: emitter terminal, 254: contact hole, 260: emitter trench portion, 262: insulating film, 264: emitter conducting portion, 270: transistor portion, 280: diode portion, 282: cathode region

What is claimed is:

1. A semiconductor device comprising:
a semiconductor substrate;
a gate trench portion formed on a front surface of the semiconductor substrate;
a dummy trench portion formed in the front surface of the semiconductor substrate; and
a first front-surface-side electrode that includes metal and is formed above the front surface of the semiconductor substrate, wherein
the gate trench portion includes:
a gate trench formed in the front surface of the semiconductor substrate;
a gate conducting portion formed inside the gate trench; and
a gate insulating portion that is formed above the gate conducting portion inside the gate trench and provides insulation between the gate conducting portion and the first front-surface-side electrode,
the dummy trench portion includes:
a dummy trench formed in the front surface of the semiconductor substrate; and
a dummy conducting portion that is formed inside the dummy trench and contacts the first front-surface-side electrode, and
the gate trench is formed to a position deeper than the dummy trench, and a width of the gate trench at the front surface of the semiconductor substrate is greater than a width of the dummy trench at the front surface of the semiconductor substrate,
at least a portion of an end surface of the dummy conducting portion on an opening side of the dummy trench is at the same height as the front surface of the semiconductor substrate,
the first front-surface-side electrode contacts the end surface of the dummy conducting portion,
at least a portion of an end surface of the gate insulating portion on an opening side of the gate trench is at the same height as the front surface of the semiconductor substrate, and
the first front-surface-side electrode contacts the end surface of the gate insulating portion.

2. The semiconductor device according to claim 1, wherein
the gate conducting portion and the dummy conducting portion are formed of the same material.

3. The semiconductor device according to claim 1, wherein
the dummy trench portion further includes a dummy insulating portion formed above the dummy conducting portion inside the dummy trench,
the dummy insulating portion includes a through-hole, and
a portion of the first front-surface-side electrode passes through the through-hole of the dummy insulating portion and contacts the dummy conducting portion.

4. The semiconductor device according to claim 3, wherein
the portion of the first front-surface-side electrode passing through the through-hole includes tungsten.

5. The semiconductor device according to claim 1, wherein
the semiconductor device comprises a main transistor portion and a sense transistor portion, and
the gate trench portion and the dummy trench portion are formed in at least one of the main transistor portion and the sense transistor portion.

6. The semiconductor device according to claim 1, wherein
a top surface of the gate conducting portion is positioned farther inside the semiconductor substrate than the front surface of the semiconductor substrate.

7. The semiconductor device according to claim 1, comprising:

a first conduction type region that is formed on the front surface of the semiconductor substrate and has the same conduction type as the semiconductor substrate; and a second conduction type region that is formed on the front surface of the semiconductor substrate and has a different conduction type than the first conduction type region, wherein the first front-surface-side electrode contacts the first conduction type region on a side wall of the dummy trench portion.

8. The semiconductor device according to claim 1, comprising:

a first conduction type region that is formed on the front surface of the semiconductor substrate and has the same conduction type as the semiconductor substrate; and a second conduction type region that is formed on the front surface of the semiconductor substrate and has a different conduction type than the first conduction type region, wherein the first front-surface-side electrode contacts the second conduction type region on a side wall of the dummy trench portion.

9. The semiconductor device according to claim 1, comprising:

a transistor portion including the gate trench portion and the dummy trench portion;

a diode portion including an emitter trench portion formed in the front surface of the semiconductor substrate; and a main transistor portion and a sense transistor portion, wherein the sense transistor portion is opposite the main transistor portion.

10. A semiconductor device comprising:

a semiconductor substrate;

a first front-surface-side electrode that includes metal and is formed above a front surface of the semiconductor substrate;

a dummy trench portion formed extending in a predetermined extension direction in the front surface of the semiconductor substrate, the dummy trench portion including:

a dummy trench formed in the front surface of the semiconductor substrate; and a dummy conducting portion that is formed inside the dummy trench and contacts the first front-surface-side electrode;

a gate trench portion formed on the front surface of the semiconductor substrate, the gate trench portion including:

a gate trench formed in the front surface of the semiconductor substrate;

a gate conducting portion formed inside the gate trench; and a gate insulating portion that is formed above the gate conducting portion inside the gate trench and provides insulation between the gate conducting portion and the first front-surface-side electrode;

an opposing portion formed extending in the extension direction in a range opposite the dummy trench portion; and a protruding portion formed extending farther from the opposing portion and in a range that is not opposite the dummy trench portion; and a second front-surface-side electrode formed above the protruding portion, wherein the gate trench is formed to a position deeper than the dummy trench, and the gate conducting portion in the protruding portion is connected electrically to the second front-surface-side electrode.

11. The semiconductor device according to claim 10, wherein in a portion of the protruding portion, the gate insulating portion is not provided and the gate conducting portion contacts the second front-surface-side electrode.

12. The semiconductor device according to claim 11, wherein in the portion of the protruding portion, at least a portion of an end surface of the gate conducting portion on an opening side of the gate trench is at the same height as the front surface of the semiconductor substrate, and the second front-surface-side electrode contacts the end surface of the gate conducting portion.

13. The semiconductor device according to claim 11, wherein the gate trench of the opposing portion is formed to a position that is deeper than the gate trench of the portion of the protruding portion.

14. The semiconductor device according to claim 13, wherein the gate trench of the portion of the protruding portion is formed to a position at the same depth as the dummy trench.

15. The semiconductor device according to claim 10, wherein the gate trench portion of the second front-surface-side electrode is shallower than the gate trench portion of an active portion.

16. A semiconductor device comprising:

a semiconductor substrate;

a gate trench portion formed on a front surface of the semiconductor substrate;

a dummy trench portion formed in the front surface of the semiconductor substrate;

a first front-surface-side electrode that includes metal and is formed above the front surface of the semiconductor substrate;

a transistor portion including the gate trench portion and the dummy trench portion; and a diode portion including an emitter trench portion formed in the front surface of the semiconductor substrate, wherein the gate trench portion includes:

a gate trench formed in the front surface of the semiconductor substrate;

a gate conducting portion formed inside the gate trench; and a gate insulating portion that is formed above the gate conducting portion inside the gate trench and provides insulation between the gate conducting portion and the first front-surface-side electrode, the dummy trench portion includes:

a dummy trench formed in the front surface of the semiconductor substrate; and a dummy conducting portion that is formed inside the dummy trench and contacts the first front-surface-side electrode, the gate trench is formed to a position deeper than the dummy trench, and the emitter trench portion is shallower than the gate trench portion.

17. A manufacturing method of a semiconductor device, comprising:
- trench formation of forming a gate trench and a dummy trench in a front surface of a semiconductor substrate;
- conducting portion formation of forming a gate conducting portion inside the gate trench and forming a dummy conducting portion inside the dummy trench;
- insulating portion formation of forming a gate insulating portion above the gate conducting portion inside the gate trench; and
- electrode formation of forming a first front-surface-side electrode that includes metal in contact with the dummy conducting portion, above the front surface of the semiconductor substrate, wherein
- the trench formation includes forming the gate trench to be deeper than the dummy trench, with a width of the gate trench at the front surface of the semiconductor substrate being greater than a width of the dummy trench at the front surface of the semiconductor substrate,
- the conducting portion formation includes forming at least a portion of an end surface of the dummy conducting portion on an opening side of the dummy trench to be at the same height as the front surface of the semiconductor substrate,
- the insulating portion formation includes forming at least a portion of an end surface of the gate insulating portion on an opening side of the gate trench to be at the same height as the front surface of the semiconductor substrate,
- the electrode formation includes forming the first front-surface-side electrode to contact the end surface of the dummy conducting portion and to contact the end surface of the gate insulating portion, and
- the conducting portion formation includes forming the gate conducting portion and the dummy conducting portion in the same process.

18. The manufacturing method according to claim 17, wherein
- the insulating portion formation includes forming an insulating film with a thickness greater than a distance in a depth direction between an end surface of the gate conducting portion and the front surface of the semiconductor substrate, on the front surface of the semiconductor substrate, and removing the insulating film formed above the front surface of the semiconductor substrate.

19. The manufacturing method according to claim 17, wherein
- in the trench formation, a mask opening of the gate trench is larger than a mask opening of the dummy trench.

* * * * *